United States Patent [19]

Murata et al.

[11] Patent Number: 4,734,673
[45] Date of Patent: Mar. 29, 1988

[54] APPARATUS FOR DETECTING A START OF AN ENGINE FOR A MOTOR VEHICLE

[75] Inventors: Youichi Murata, Nagoya; Fumioki Shibata, Okazaki, both of Japan

[73] Assignee: Toyota Jidosha Kabushiki Kaisha, Toyota, Japan

[21] Appl. No.: 840,477

[22] Filed: Mar. 14, 1986

Related U.S. Application Data

[63] Continuation of Ser. No. 453,154, Dec. 27, 1982, abandoned.

[30] Foreign Application Priority Data

Dec. 28, 1981 [JP] Japan ............................ 56-197131[U]

[51] Int. Cl.4 ........................ B60Q 1/00; G08B 21/00
[52] U.S. Cl. .................................. 340/52 R; 340/648; 324/158 MG
[58] Field of Search ............... 324/102, 127, 158 MG; 123/179 B; 340/648, 664, 52 R; 361/23

[56] References Cited

U.S. PATENT DOCUMENTS 3,056,922 10/1962 DuVall et al. ..................... 324/127
3,172,283 1/1973 Kiess et al. ........................ 123/179 B
3,885,543 5/1975 Swartz ............................... 123/179 B
3,986,116 10/1976 Smith et al. ....................... 324/127
4,198,945 4/1980 Eyermann et al. .............. 123/179 B Primary Examiner—James L. Rowland
Assistant Examiner—Brian R. Tumm
Attorney, Agent, or Firm—Cushman, Darby & Cushman

[57] ABSTRACT

Apparatus for detecting the start and stop of an engine starter motor includes a sensor, an amplifier, a comparator, and a monostable multivibrator. When a starter motor starts and stops, magnetic flux around the starter motor varies greatly. The sensor senses this varying magnetic flux and produces a voltage signal corresponding to the magnetic flux variation. The voltage signal is amplified by the amplifier so that the amplified voltage signal is fed to the comparator. When the voltage signal fed to the comparator is greater than the reference voltage of the comparator, a pulse signal is fed to the multivibrator, and in turn the multivibrator is triggered to output detecting signals corresponding to the start or stop of the starter motor. A warning lamp or buzzer may be energized by the detecting signal from the multivibrator.

8 Claims, 3 Drawing Figures

4,734,673

APPARATUS FOR DETECTING A START OF AN ENGINE FOR A MOTOR VEHICLE

This is a continuation of application Ser. No. 453,154, filed Dec. 27, 1982, which was abandoned upon the filing hereof.

BACKGROUND OF THE INVENTION

The present invention relates to an apparatus for detecting a starting state of an engine, and more particularly to an apparatus for detecting the starting state of the engine at an inspection line of a factory and the like.

At the inspection line of the factory and the like, if an inspector starts an engine by mistake during inspection of a motor vehicle and the motor vehicle starts running, an inspection apparatus and the motor vehicle to be inspected may be damaged or the inspectors may be injured.

To prevent the occurence of the above accidents due to the careless operation of the inspector, a stopper may be used for the motor vehicle which prevents the motor vehicle from running even in response to the start of the engine.

However, the above-mentioned stopper may not be able to be used for all types of motor vehicles due to its structual difficulties, and an automatic type stopper requires a large number of instruments and so forth. Therefore, the prevention of the above-described accidents is still, in most part, depending on intensive care by the inspector.

SUMMARY OF THE INVENTION

An object of the present invention is to provide an apparatus for detecting a start of an engine, in which the starting state of the engine can be accurately detected.

According to the present invention, a sensor senses a change over time of the magnetic flux around a starter motor or a wire connecting the starter motor to a battery. The sensor outputs a voltage signal, which varies in response to the change of the magnetic flux corresponding to the change over time of the current flowing to the starter motor, to a judging device. In the judging device, the voltage signal is compared with a reference voltage value to output a detecting signal indicating that the engine is started.

Since a current flowing to the starter motor is abruptly varied when the starter motor is started and stopped, the sensor detects the variation of the magnetic flux in response to the variation of the current at each start or stop. Accordingly, the judging device outputs two detecting signals indicating the start and stop of the engine respectively.

DESCRIPTION OF THE PREFERRED EMBODIMENT

Figure 1:
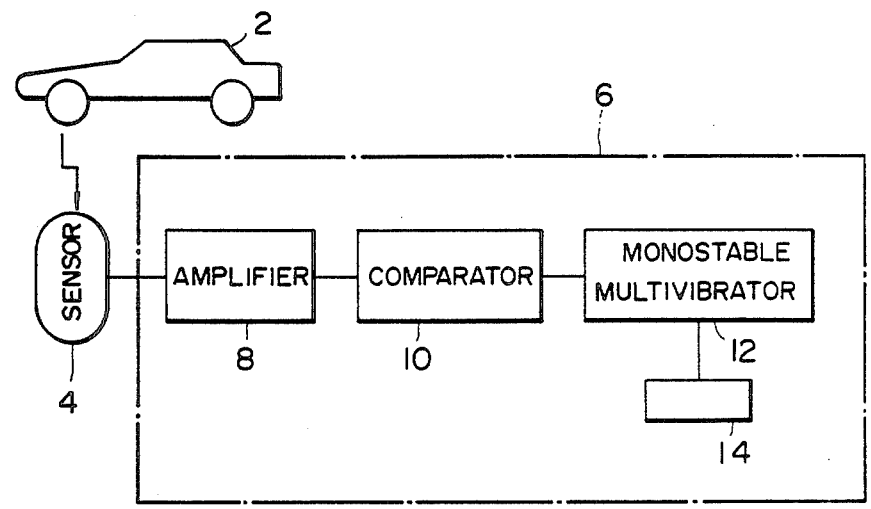
FIG. 1 is a schematic block diagram showing an embodiment according to the present invention.

Referring to FIG. 1, numeral 2 denotes a motor vehicle having an internal combustion engine which is started by a starter motor connected to a battery via a wire. A sensor 4 for sensing a magnetic flux outputs a voltage signal corresponding to a change with time of a current flowing to the starter motor from the battery. The sensor 4 is connected to a judging device 6, which includes an amplifier 8, a comparator 10, a monostable multivibrator 12 and an output terminal 14. The judging device outputs a detecting signal indicating that the starter motor is started and stopped. The sensor 4 and the judging device 6 are provided separately from the motor vehicle. More specifically, when the apparatus according to the present invention is used for inspection, the sensor 4 is placed around the starter motor or the wire connecting the starter motor to the battery, and after the inspection the sensor 4 is detached from the motor vehicle.

Figure 2:
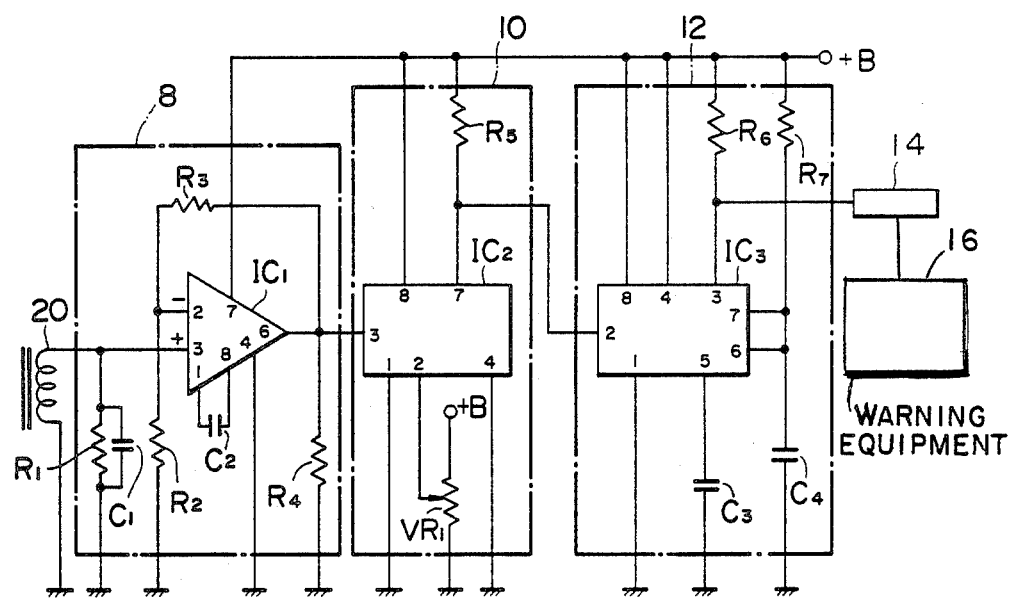
FIG. 2 is a circuit diagram illustrating in detail each element shown in FIG. 1.

Referring to FIG. 2, the sensor 4 includes a coil 20 detecting the magnetic flux which varies in response to the change of the current flowing to the starter motor from the battery. One end of the coil 20 is connected to an input terminal of the amplifier 8 and the other end thereof is connected to a ground.

The amplifier 8 includes an integrated circuit (operational-amplifier) IC, resistors $R_1$, $R_2$, $R_3$ and $R_4$ and condensers $C_1$ and $C_2$. An output terminal of the amplifier 8 is connected to an input terminal of the comparator 10 which includes an integrated circuit (voltage comparator) IC, a resistor $R_5$ and a variable resistor $VR_1$.

An output terminal of the comparator 10 is connected to an input terminal of the monostable multivibrator 12 which includes an integrated circuit (precision timer) $IC_3$, resistors $R_6$ and $R_7$ and condensers $C_3$ and $C_4$. An output terminal of the multivibrator 12 is connected to an external output terminal 14 of the judging device 6.

The terminal No. 7 of the integrated circuit $IC_1$ and the terminals No. 8 of the integrated circuts $IC_2$ and $IC_3$ are connected to a voltage supply, respectively, and the terminals No. 4 of the integrated circuits $IC_1$ and $IC_2$ and the terminal No. 1 of the integrated circuit $IC_3$ are connected to ground.

The following table gives the manufacturer and the manufacturer's part number for the integrated circuits in this apparatus.

| Reference No. | Part No. | Manufacturer |
| --- | --- | --- |
| $IC_1$ | CA 3130 | RCA Corporation |
| $IC_2$ | LM 311 | National Semiconductor Corporation |
| $IC_3$ | SN 72555 | National Semiconductor Corporation |

Figure 3:
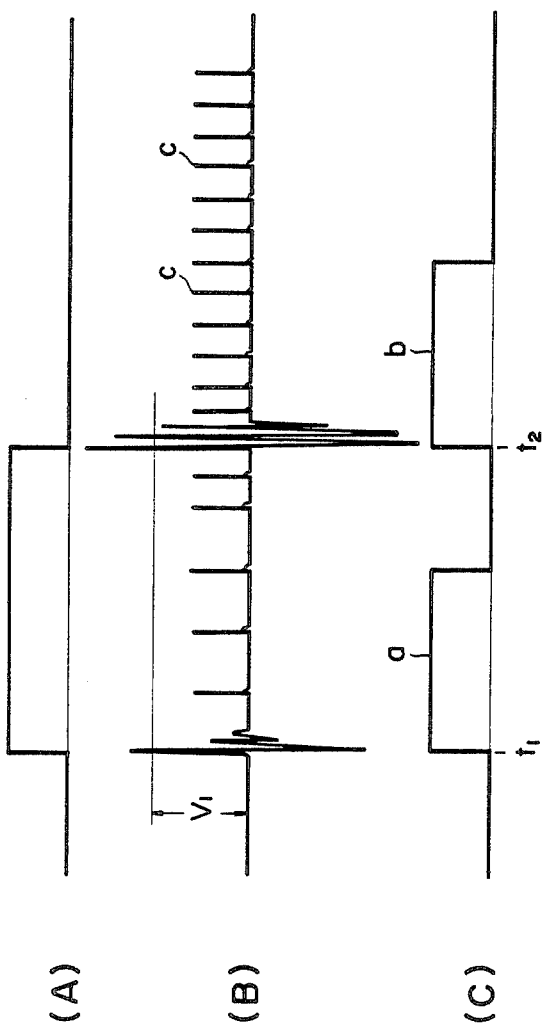
FIG. 3A is a time chart illustrating the operation signal of the starter motor.
FIG. 3B is a time chart illustrating the change over time of the current flowing to the starter motor from the battery.
FIG. 3C is a time chart illustrating the detecting signal outputted from the monostable multivibrator.

With reference to FIGS. 3A, 3B and 3C, operation of the preferred embodiment of the apparatus described above according to the present invention will be provided below.

When the starter motor is started at time point $t_1$ as shown in FIG. 3A, the current flowing through the wire to the starter motor from the battery varies from zero to several hundreds of amps and results in variation of the magnetic flux around the starter motor and the wire. This in turn energizes the coil 20 of the sensor 4 so that a variation in coil voltage results in response to that of the magnetic flux.

The voltage signal thus generated in the coil 20 is fed to the amplifier 8 so that the voltage signal is amplified to a desired amplitude. FIG. 3B shows the waveform of the amplified voltage signal which is outputted from the amplifier 10.

The amplified voltage signal is fed to the comparator 10 for comparison with a reference voltage $V_1$ as shown in FIG. 3B set by the variable resistor $VR_1$. The variable resistor $VR_1$ is adjusted so that the amplitude of the reference voltage $V_1$ is more than that of ignition noise (shown at C) in voltage superposed on the amplified voltage signal fed from the amplifier 8.

When the amplitude of the amplified voltage signal is more than that of the reference voltage $V_1$, that is, when the starter motor is started at the time point $t_1$, the comparator 10 outputs a pulse signal to the monostable multivibrator 12. Upon receiving the pulse signal from the comparator 10 the multivibrator 12 is triggered by the trailing edge of the received pulse signal to produce the detecting signal a, which indicates that the starter motor has started, for a metastable time period of the multivibrator 12 as shown in FIG. 3C. The detecting signal a thus produced is received by the external output terminal 14 from which the detecting signal a is fed to external warning equipment 16, for example, a warning lamp or a warning buzzer and the like which lets the inspector know of the start of the engine.

After the starter motor has started, since the current of several tens of amps flowing to the starter motor does not substantially vary, a voltage signal greater than the reference voltage $V_1$ in value is not outputted from the amplifier 8. Consequently, when the current of several tens of amps flowing to the starter motor is interrupted at a time point $t_2$ to stop the starter motor, the large amplitude of the coil voltage is induced in the coil 20 and forms a waveform of the voltage signal as shown FIG. 3B at time point $t_2$. When the voltage signal thus produced and exceeding the reference voltage in value is fed to the comparator 10, the comparator 10 outputs a pulse signal which is fed to the multivibrator 12. The trailing edge of this pulse signal in turn triggers the multivibrator 12 to output the detecting signal b, which indicates that the starter motor is stopped at the time point $t_2$, for the metastable time period of the multivibrator 12 as shown FIG. 3C. The detecting signal b is also received by the external output terminal 14 for the same purpose described above.

The apparatus described above can be applied to a diesel engine wherein no ignition noise is produced because there is no ignition plug. Therefore, in the case of the application of the present invention to the diesel engine, the judging device 6 is relatively simplified as compared with a gasoline engine.

What is claimed is:

1. An apparatus for detecting the start and stop of an engine starter motor energized through a wire from a battery in a motor vehicle, comprising:
    sensor means including a coil detachably disposed around said wire for sensing variations in a magnetic flux generated around said wire when a direct current for driving said starter motor starts flowing and subsequently stops flowing from said battery through said wire to said starter motor, and for outputting voltage signals corresponding to said variations in magnetic flux; and
    judging means for comparing said voltage signals outputted from said sensor means with a reference voltage signal and for outputting detecting signals which indicate respectively that said starter motor is started and stopped when said voltage signals exceed said reference voltage signal by a predetermined amount, said judging means comprising an amplifier for amplifying said voltage signals, a comparator for comparing each amplified voltage signal with said reference voltage signal to generate a pulse signal when an amplified voltage signal exceeds said reference voltage by said predetermined amount, and a monostable multivibrator responsive to said pulse signal from said comparator to generate said detecting signals to provide an indication of starting and stopping of said starter motor.

2. An apparatus according to claim 1, wherein said reference signal is predetermined as to be above an ignition noise of said engine induced in said coil.

3. An apparatus according to claim 1, wherein said apparatus is detachable to said vehicle.

4. An apparatus according to claim 2, wherein said apparatus is detachable to said vehicle.

5. An apparatus for warning of a start and stop of an engine starter motor energized through a wire from a battery in a motor vehicle, comprising:
    sensor means including a coil detachably disposed around said wire for sensing variations in a magnetic flux generated around said wire when a direct current for driving said starter motor starts flowing and subsequently stops flowing from said battery through said wire to said starter motor and for outputting voltage signals corresponding to said variations in magnetic flux; and
    judging means for comparing said voltage signals outputted from said sensor means with a reference voltage signal and for outputting detecting signals which indicate respectively that said starter motor is started and stopped when said voltage signals exceed said reference voltage signal by a predetermined amount, said judging means comprising an amplifier for amplifying said voltage signals, a comparator for comparing each amplified voltage signal with said reference voltage signal to generate a pulse signal when an amplified voltage signal exceeds said reference voltage signal by said predetermined amount, a monostable multivibrator responsive to said pulse signal from said comparator to generate said detecting signals to provide an indication of starting and stopping of said starter motor; and
    warning means for warning of said start of the engine in response to the one of said respective detecting signals from said judging means indicating that said starter motor is started.

6. An apparatus for warning of a start of an engine in a motor vehicle according to claim 5, wherein said reference signal is predetermined to be above an ignition noise of said engine induced in said coil.

7. An apparatus for warning of a start of an engine in a motor vehicle according to claim 5, wherein said apparatus is detachable to said motor vehicle.

8. An apparatus for warning of a start of an engine in a motor vehicle according to claim 6, wherein said apparatus is detachable to said motor vehicle.

* * * * *